United States Patent [19]

Schmiemann

[11] Patent Number: 4,945,346

[45] Date of Patent: Jul. 31, 1990

[54] AUDIBLE CIRCUIT TRACER

[76] Inventor: John P. Schmiemann, 4 Seville La., Story Brook, N.Y. 11790

[21] Appl. No.: 390,289

[22] Filed: Aug. 7, 1989

[51] Int. Cl.$^5$ .............................................. G08B 21/00
[52] U.S. Cl. .............................. 340/656; 340/384 E; 340/693; 181/141; 324/508
[58] Field of Search .................. 340/656, 384 E, 693; 324/506, 508, 510, 511, 538, 55; 181/141; 362/253; 381/88, 90, 205, 188; 307/125, 126

[56] References Cited

U.S. PATENT DOCUMENTS

| | | | |
|---|---|---|---|
| 2,518,812 | 8/1950 | Oswald | 340/656 |
| 2,696,607 | 12/1954 | Witkin | 340/656 |
| 3,277,465 | 10/1966 | Potter | 340/384 E |
| 3,879,726 | 4/1975 | Sweany | 340/384 E |
| 4,155,082 | 5/1979 | Nones et al. | 340/656 |
| 4,223,307 | 9/1980 | Albeitton | 340/656 |
| 4,725,772 | 2/1988 | Peak | 324/508 |
| 4,776,018 | 10/1988 | Cordier | 381/88 |
| 7,305,514 | 6/1919 | Berry | 340/656 |

Primary Examiner—Joseph A. Orsino
Assistant Examiner—Jill Jackson
Attorney, Agent, or Firm—Leonard Belkin

[57] ABSTRACT

An audible circuit tracer which is palm size for indicating audibly the presence of electric power in an outlet. The tracer consists of a cylindrical housing containing a step down transformer, a full wave rectifier and a piezo buzzer for sounding in the presence of electric power. The sound being emitted can be muffled adjustably and there is provision for a light as well.

2 Claims, 1 Drawing Sheet

AUDIBLE CIRCUIT TRACER

BACKGROUND OF THE INVENTION

The present invention relates to an audible circuit tracer and more particularly to a compact device for indicating in an audible manner whether an electrical outlet is live and a safe method for terminating electric power to said outlet.

When an electrician, construction worker, or homeowner has to service or change an outlet or electrical device, it is necessary and safe practice to shut off the circuit breaker or fuse supplying power. When unmarked, finding the proper fuse or circuit breaker is time consuming, and wastes the time of skilled labor.

A number of devices have been developed for indicating the presence of electrical power and for the interruption of power. Such devices generally can be complicated or require that the outlet be approached for inserting the devices.

The following U.S. Pat. Nos. illustrate such devices: 1,305,514, 2,518,812, 2,696,607, 4,155,082, and 4,223,307. None of the preceding patents discloses the present invention.

SUMMARY OF THE INVENTION

In this invention there is provided a device sufficiently compact that it may be carried on a tool belt and capable of producing a sound which can be heard at a distance so that it is not necessary to leave the location of the circuit breaker or fuse box to determine whether or not the power feeding the outlet or electrical device has been turned off in a remote location.

In accordance with a preferred embodiment of this invention there is provided a small cylindrical housing containing at one end a piezo electric buzzer and at the other end the prongs to be inserted into an electrical outlet. Within the housing is a transformer to drop the voltage and a rectifier to convert the ac into a dc voltage which is then delivered to the piezo electric buzzer.

With such a device installed in an outlet or electrical device, the worker can hear the buzzer even though he/she may not be able to have the outlet or electrical device in view. The buzzer will shut off when the proper circuit breaker or fuse controlling the outlet or electrical device has been located.

It is thus a principal object of this invention to provide a device for indicating audibly when electrical power is applied to an outlet.

Other objects and advantages of this invention will hereinafter become obvious from the following description of preferred embodiments of this invention.

DETAILED DESCRIPTION OF THE PREFERRED EMBODIMENT

Figure 1:
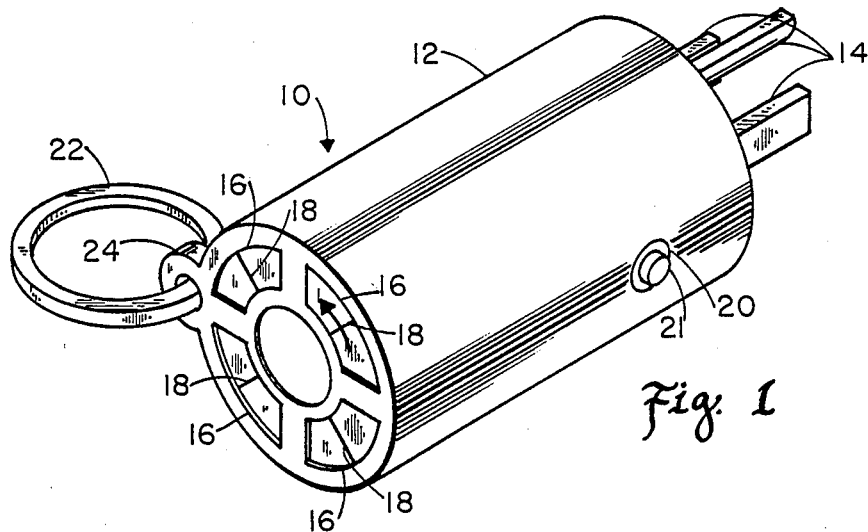
FIG. 1 is an isometric view of a preferred embodiment of this invention.

Referring to FIG. 1, audible circuit tracer 10 consists of a cylindrical housing 12 having electrical prongs 14 for engaging the three openings (including ground) in a typical electrical outlet, and radially disposed openings 16 at the other end. Tracer 10 is portable and palm size by which is meant herein that the device is small enough to be cradled in the hand of the average size adult person, and is suitable for being carried around and, if desired, hung from a tool belt.

Openings 16 are provided with shutters 18 which are connected together. When rotated in the direction shown by the arrow, the size of openings 16 may be reduced in order to muffle the sound emanating from within housing 12. By rotating shutters 18 in the opposite direction the size of openings 16 is increased and the sound emanating increases in intensity. Shutters 18 are moved by the tips of one's fingers. An opening 20 for a light bulb 21 is located at some convenient point in the wall of housing 12.

At one end of housing 12 as illustrated is connected to a key ring 22 through a loop 24 attached to housing 12 thereby making it possible and convenient to carry tracer 10 on tool belt.

Figure 2:
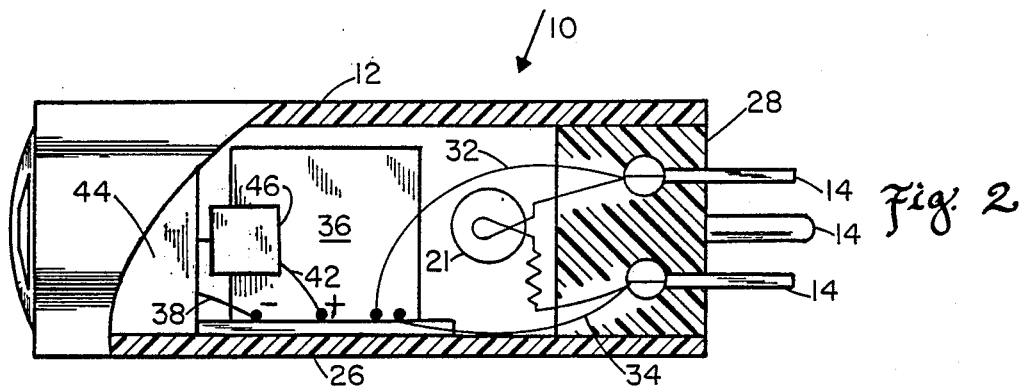
FIG. 2 is an elevation view in partial section of the embodiment shown in FIG. 1.

As seen in FIG. 2, housing 12 consists of a cylindrical tube 26 having a plug 28 at one end to carry one end of all of prongs 14. Two of prongs 14 are wired through conductors 32 and 34 to the primary side of a step down transformer 36. A pair of leads 38 and 42 go from the secondary side of transformer 36 to a piezo two tone buzzer 44 through a full wave bridge rectifier 46.

Electric light bulb 21 is wired in parallel across electrical leads 32 and 34 to glow when there is electrical power present.

In the use of audible circuit tracer 10, the latter is plugged into the outlet to be monitored. If the outlet is powered then buzzer 44 will sound, and light 21 will glow. The principal and most important use of tracer 10 is when the outlet or electrical device is powered and the worker must go to the circuit breaker or fuse box to turn off the power and is out of sight of the outlet or electrical device. In such a case the worker will adjust the sound level using shutters 18 so that he will hear the buzzing where the circuit breakers or fuses are located. With tracer 10 plugged into the outlet the buzzer will shut off when he or she locates the proper circuit breaker or fuse controlling the outlet or electrical device or tries different breakers or fuses until the right one is located.

Figures 3, 4:
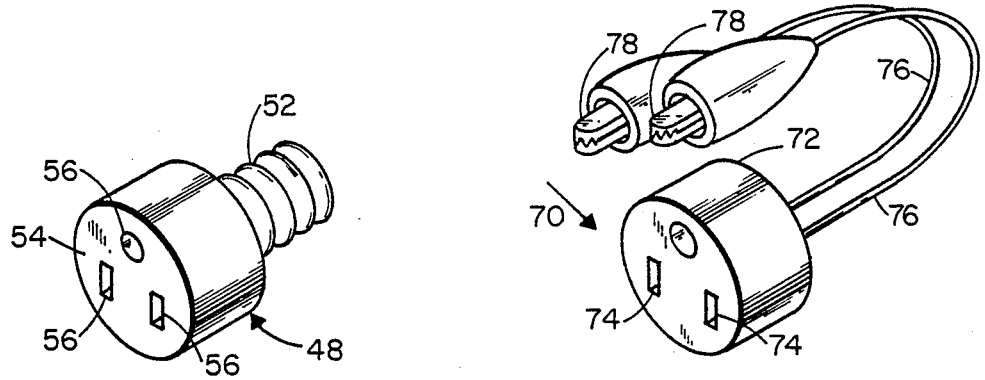
FIG. 3 is an isometric view of an accessory for using the device with a light socket.
FIG. 4 is an isometric view of an accessory for using the device with hard-wired appliances and other electrical equipment.

When the electric outlet to be checked is the socket for a light bulb, then adaptor 48 shown in FIG. 3 may be employed. Adaptor 48 is provided at one end with male threaded extension 52 to go into the socket to be tested, and a face 54 at the other end having openings 56 to receive prongs 14 of tracer 10. Thus, with adaptor 48 threaded into the light socket to be tested and tracer 10 plugged into the other end of adaptor 10 the procedure as described above is repeated to test the integrity of the socket.

In the event an electrical appliance or other equipment which is hard-wired is to be tested, adapter 70 shown in FIG. 4 may be employed. Adapter 70 consists of a body 72 with sockets 74 to accommodate prongs 14 of tracer 10 and a pair of leads 76 electrically tied to sockets 74 at one end and terminating in a pair of insulated alligator clips 78 for using in making the connection to the appliance for determining if there is power available.

In the event the circuit breaker or fuse box is very remotely located where there is a question whether the sound emitted by tracer 10 will carry a sufficient distance to be heard by the worker, any ordinary electrical extension cord may be plugged into the outlet and tracer 10 plugged into the other end of the extension cord which may be placed at a more convenient location.

While only a preferred embodiment of the invention has been described it is understood that many variations of this invention are possible in accordance with the principles of this invention as defined in the claims which follow.

What is claimed is:

1. A portable electric power indicator assembly comprising:
    a. a palm size cylindrical housing having electric prongs at one end for plugging into an electrical outlet;
    b. said housing having mounted in the other end thereof a piezo energized buzzer and including an attachment for carrying said housing on a tool belt;
    c. a step down transformer within said housing having the primary coil thereof connected to two of said electric prongs;
    d. a full wave bridge rectifier;
    e. electrical conductors connecting the second coil of said transformer to said piezo buzzer through said rectifier so that only dc will be delivered to said buzzer;
    f. openings at the end of said housing opposite the end carrying said prongs for broadcasting the buzzer sounds when said piezo buzzer is activated, said openings having adjustable shutters for permitting said sounds to be selectively baffled;
    g. an adaptor for checking a bulb socket, said adaptor comprising a threaded male member at one end to thread into said bulb socket and openings at the other end for receiving said prongs on said housing; and
    h. an adaptor for checking hard-wired electrical equipment, said adaptor comprising a member having openings for receiving said prongs and leads connected to said openings terminating in insulated alligator clips for electrical engagement to said equipment.

2. A safe method for terminating electric power to an electrical outlet comprising the steps of:
    a. inserting into said electrical outlet a palm size power indicator comprising: (i) a cylindrical housing having electric prongs at one end for plugging into said outlet, (ii) said housing having mounted in the other end thereof a piezo energized buzzer, (iii) a step down transformer within said housing having the primary coil thereof connected to two of said electric prongs, (iv) a full wave bridge rectifier, (v) electrical conductors connecting the secondary of said transformer to said buzzer through said rectifier so that only dc will be delivered to said buzzer, (vi) openings at the end of said housing opposite the end carrying said prongs for broadcasting the buzzer sound when said buzzer is activated, and (vii) said openings having adjustable shutters for permitting said sounds to be selectively baffled; and
    b. adjusting said shutters so that the noise level emanating from said openings is sufficient to be heard where a circuit breaker or fuse has to be deactivated to terminate the electric power to said outlet; and
    c. deactivating circuit breakers or fuses in sequence until the correct breaker or fuse is deactivated to cause the sound from said indicator to stop.

* * * * *